# (12) United States Patent
Kamamori et al.

(10) Patent No.: US 6,203,950 B1
(45) Date of Patent: *Mar. 20, 2001

(54) METHOD FOR MANUFACTURING A COLOR FILTER

(75) Inventors: Hitoshi Kamamori; Koji Iwasa; Takakazu Fukuchi; Mitsuru Suginoya; Tsutomu Watanabe; Toshiaki Ota; Junichi Yasukawa, all of Tokyo (JP)

(73) Assignees: Shinto Chemitron Co. Ltd.; Seiko Instruments Inc., both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 07/840,345

(22) Filed: Feb. 24, 1992

(30) Foreign Application Priority Data

Feb. 25, 1991 (JP) .................................................. 3-030464

(51) Int. Cl.⁷ ............................. G02B 5/20; G02F 1/1335
(52) U.S. Cl. .................................................. 430/7
(58) Field of Search .................... 430/7, 20, 321; 359/74, 68; 205/118, 122; 349/106, 111

(56) References Cited

U.S. PATENT DOCUMENTS

| | | | |
|---|---|---|---|
| 4,522,691 | 6/1985 | Suginoya et al. | 204/18.1 |
| 4,565,756 * | 1/1986 | Needs et al. | 430/321 |
| 4,617,094 | 10/1986 | Kamamori et al. | 204/18.1 |
| 4,779,957 | 10/1988 | Suginoya et al. | 350/339 R |
| 4,935,757 * | 6/1990 | Hatano et al. | 359/68 |
| 5,045,418 * | 9/1991 | Fukuyoshi | 430/7 |
| 5,128,786 * | 7/1992 | Yanagisawa | 359/68 |

FOREIGN PATENT DOCUMENTS

| | | |
|---|---|---|
| 0113237 | 7/1984 | (EP) . |
| 0226218 | 6/1987 | (EP) . |
| 0238174 | 9/1987 | (EP) . |
| 0338412 | 10/1989 | (EP) . |
| 1-138530 * | 5/1989 | (JP) . |
| 1-170902 * | 6/1989 | (JP) . |

OTHER PUBLICATIONS

Patent Abstracts of Japan, vol. 015, No. 116 (p–1182) Mar. 20 1991 JP–A–3 006 532 (Sharp Corp.) Jan. 14, 1991.

Patent Abstracts of Japan, vol. 013, No. 443 (p–941) Oct. 5, 1989 JP–A–1 170 902 (Seiko Instr & Electron Ltd.) Jul. 6, 1989.

Patent Abstracts of Japan, vol. 014, No. 008 (p–987) Jan. 10, 1990 JP–A–1 257 904 (Seiko Instr & Electron Ltd.).

Patent Abstracts of Japan, vol. 014, No. 240 (p–1051) May 22, 1990 JP–A–2 061 601 (Seiko Instr Inc.) Mar. 1, 1990.

Patent Abstracts of Japan, vol. 10, No. 149 (p. 461) [2206], May 30, 1986, Dainippon Ink Kagaku Kogyo K.K.

* cited by examiner

*Primary Examiner*—John A. McPherson
(74) *Attorney, Agent, or Firm*—Adams & Wilks

(57) ABSTRACT

The present invention discloses color pattern manufacturing method comprising the steps of forming a conductive film having an arbitrary pattern on a substrate, forming a colored layer on the conductive film by electrodeposition, and forming a method film having an arbitrary pattern on the colored layer to shield undesirable light transmittance through between the arbitrary patterns of the colored layer, so that the color filter having high quality is made by remarkably simple process.

11 Claims, 4 Drawing Sheets

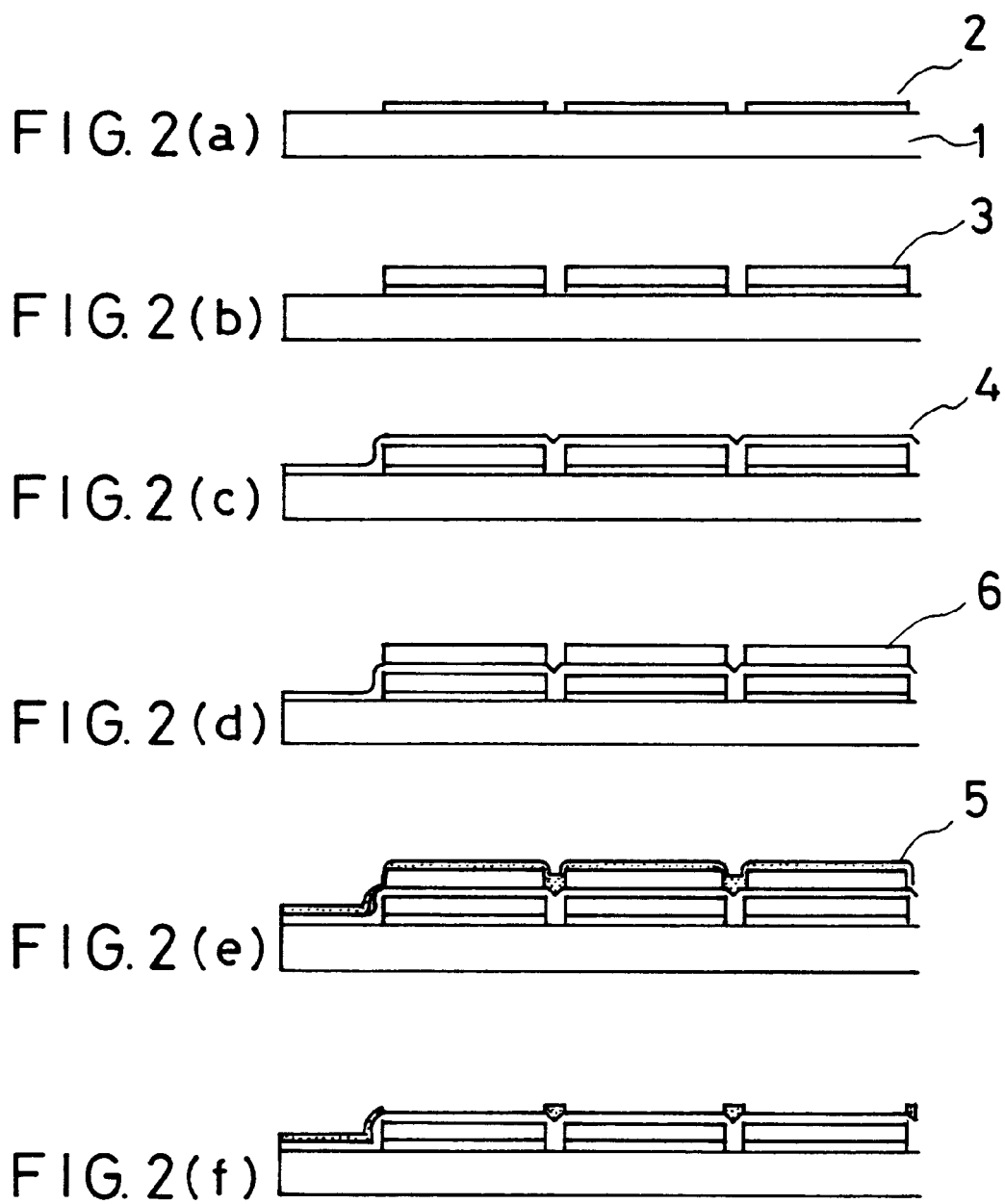

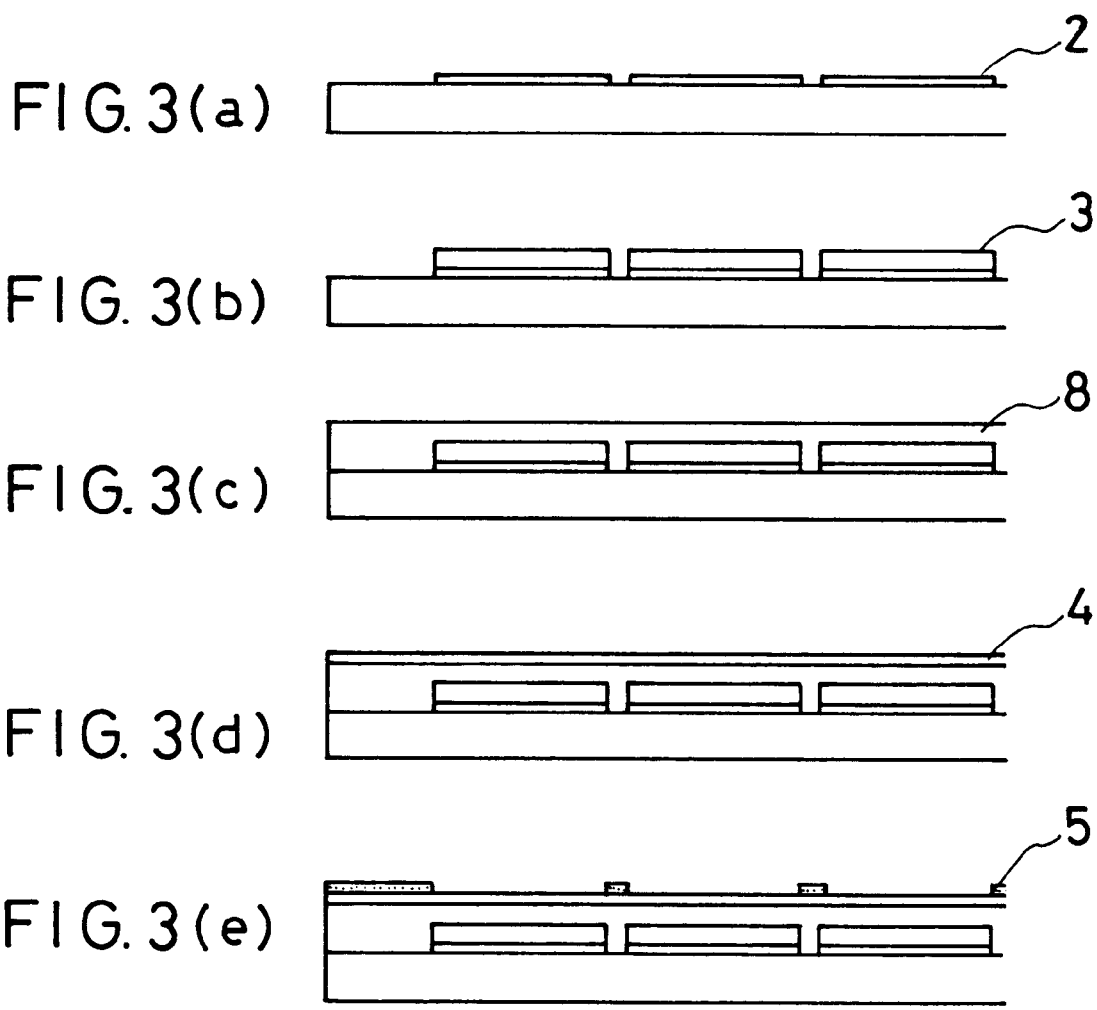

LIGHT

METHOD FOR MANUFACTURING A COLOR FILTER

BACKGROUND OF THE INVENTION

The present invention relates to a method of manufacturing a color filter, and, although the invention is not so restricted, it relates more particularly to the manufacture of a color filter used for a liquid crystal color display and a colored scale of a video image camera.

The most convenient method of producing a color filter is by printing. However, printing has the problems that location during multicolor printing is difficult, and a high accuracy and a fine pattern cannot be achieved. A color filter having high accuracy and a very fine pattern, for use in a camera or the like, is therefore usually produced by photo-lithography. Although, however, photo-lithography provides a sufficiently high accuracy and fineness, a separate photo-lithographic process has to be carried our for each color, and this makes the manufacture extremely complicated. In addition, there is a limit to the size of the substrate that can be handled, due to limits imposed on devices such as an aligner.

Recently, a method of manufacturing a color filter has been developed by forming color layers by electrodeposition. The method is a very simple process and produces highly accurate patterns.

In a conventional color pattern manufacturing process using electric deposition, as shown in FIG. 4, a colored layer 3 (as shown in FIG. 4(b)) is formed by electric deposition over a conductive film 2 (as shown in FIG. 4(a)) having an arbitrary pattern. Next, a negative type photosensitive resin 7 having a black pigment dispersed therein is applied (as shown in FIG. 4(c)). The substrate has its back exposed (as shown in FIG. 4(c)) by using the colored layer as a photo mask. After a development (as shown in FIG. 4(d)), a transparent conductive film 4 is formed (as shown in FIG. 4(e)), and the photosensitive resin has a stripe shape (as shown in FIG. 4(f)).

In the liquid crystal display of thin film transistor type expected in recent years to have a promising future, however, a shielding film is required to improve the shielding efficiency of the device so as to prevent optical leakage of a switching element. In order to improve the image quality, the shielding film is required to have a lattice-shaped pattern. In the existing manufacture process, however, the black pigment is dispersed in the resist so that its amount is limited and fails to provide the required shielding efficiency. Since, moreover, the shielding film is formed by the exposure of the substrate back using the colored layer as the mask, there arises a problem in that it is difficult to form the shielding film into the lattice shape.

It is, therefore, an object of the present invention to solve the above-specified problems of the prior art and to provide a process for manufacturing a multi-color pattern having a shielding film which has a high shielding efficiency and can be formed into an arbitrary pattern shape.

SUMMARY OF THE INVENTION

In order to solve the above-specified problems, according to the present invention, there is provided a process for manufacturing a color pattern having a shielding film which has a high shielding efficiency and which can be formed into an arbitrary pattern shape, which process comprises a first step of forming a conductive film having an arbitrary pattern over a substrate having an insulating surface; a second step of forming a colored layer over said conductive film by an electric deposition; a third step of forming a transparent conductive film over said colored layer; and a fourth step of forming a metal film having an arbitrary pattern over said transparent conductive film.

In the color pattern manufacturing process thus described, the shielding film used is exemplified by the metal film so that a high shielding efficiency can be achieved. Since, moreover, the metal film can be easily patterned into an arbitrary shape by a lift-off method or an etching method, it is possible to form a shielding film having a pattern shape suited for a variety of display device systems.

BRIEF EXPLANATION OF THE DRAWINGS

FIGS. 2(a)–2(f) are explanatory views of a second example of the present invention for producing a color filter.

FIGS. 3(a)–3(e) are explanatory views of a third example of the present invention for producing a color filter.

DETAILED DESCRIPTION OF THE INVENTION

The present invention will be described in the following in connection with the preferred embodiments thereof with reference to the accompanying drawings.

EXAMPLE 1

Figure 1A:
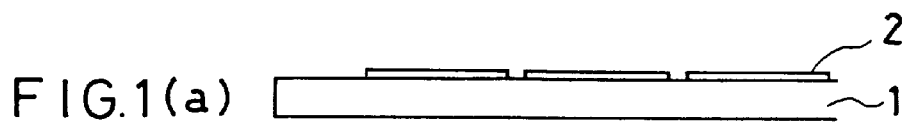
FIGS. 1(a)–1(i) are explanatory views of a first example of the present invention for producing a color filter.

FIG. 1 shows a first example. The manufacturing steps are as follows:

(1) An ITO film 2 is formed over an insulating film 1 by a sputtering method and etched (as shown in FIG. 1(a)) into an electrically depositable arbitrary pattern. This electrically depositable pattern is a stripe pattern, as shown in FIG. 1(h).

Figure 1B:
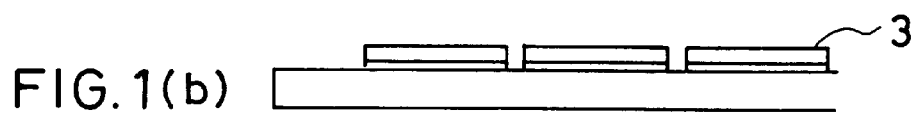

(2) A colored layer 3 is formed (as shown in FIG. 1(b)) over the ITO film by an electric depositing method. In case colored layers of a plurality of colors are to be formed at this time, the electric depostions may be repeated for the individual colors.

Figure 1C:
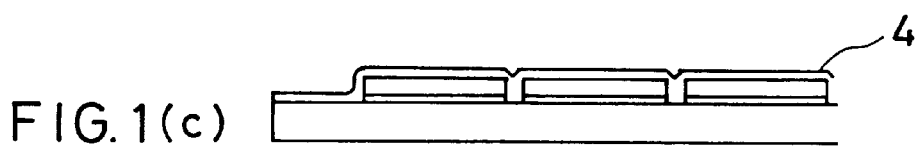

(3) An ITO film 4 is formed (as shown in FIG. 1(c)) by a sputtering method. Since the colored layer was already formed over the substrate, the filming temperature may desirably be at 250° C. or less. The ITO film 4 is used as a driving electrode of a display device.

Figure 1D:
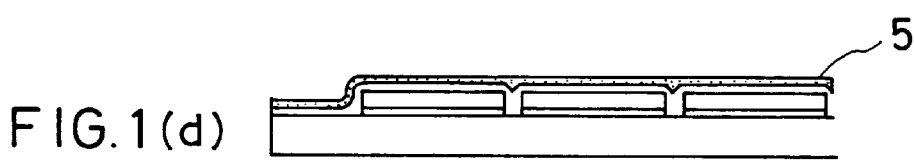

(4) Moreover, a metal film 5 of Cr or the like is formed (as shown in FIG. 1(d)) by a sputtering method or the like. This metal film is used as the shielding film.

Figure 1E:
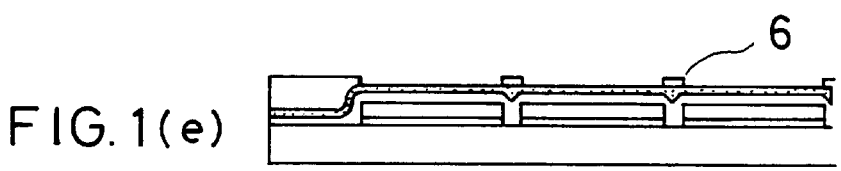

(5) A photoresist 6 is exposed and developed (as shown in FIG. 1(e)) into a desired shielding pattern. The pattern shape can be an arbitrary one such as a lattice-shaped pattern, as shown in FIG. 1(i).

Figure 1F:
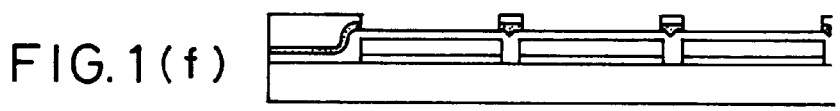

(6) The metal film 5 is etched (as shown in FIG. 1(f)).

Figure 1G:
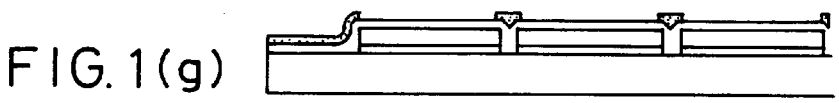
Figure 1H:
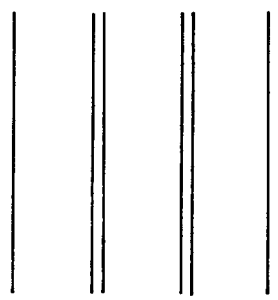
Figure 1I:
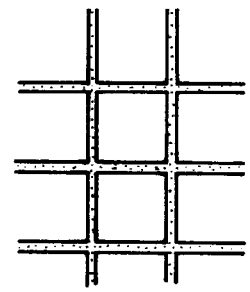
Figure 4A:
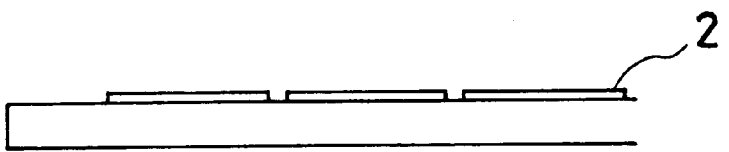
FIGS. 4(a)–4(f) are explanatory views of an example of the prior art.
Figure 4B:
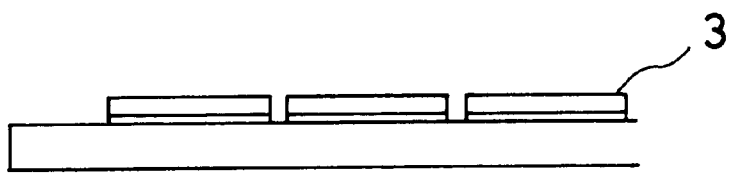
Figure 4C:
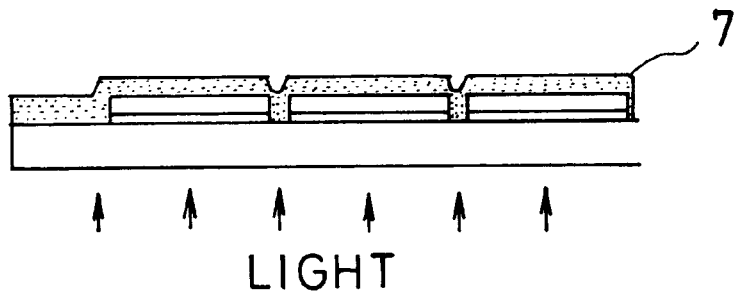
Figure 4D:
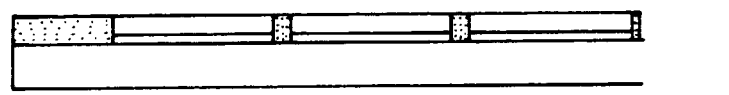
Figure 4E:
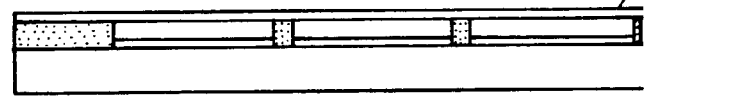
Figure 4F:
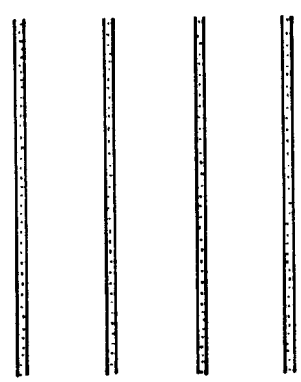

(7) The photoresist 6 is peeled off (as shown in FIG. 1(g)).

By the steps described above, a shielding film having a shielding efficiency of 100% and a lattice-shaped pattern can be formed remarkably simply to realize a remarkably convenient multi-color pattern manufacturing process together with the electric deposition.

EXAMPLE 2

FIG. 2 shows a second example. The manufacturing steps are as follows:

(1) The color layer 3 and the ITO film 4 are formed (as shown in FIGS. 2(a), 2(b) and 2(c)) like the first example.
(2) The photoresist 6 is exposed and developed (as shown in FIG. 2(d)) into a desired shielding film pattern.
(3) The metal film 5 of Cr or the like is formed (as shown in FIG. 2(e)) by the sputtering method.
(4) The photoresist 6 is peeled off (as shown in FIG. 2(f)).

This example is a process for patterning the metal film by the lift-off method and could dispense with the metal film etching step used in the first example to simplify the steps more.

EXAMPLE 3

FIG. 3 shows a third example. The manufacturing steps are as follows:
(1) The colored layer 3 is formed (as shown in FIGS. 3(a) and 3(b)) like the first example.
(2) An organic film 8 is applied by a spinner and set. The organic film may preferably be made of high leveling material such as an epoxy resin or an acrylic resin (as shown in FIG. 3(c)).
(3) The ITO film 4 is formed (as shown in FIG. 3(d)) by the sputtering method or the like.
(4) Like the first or second example, the metal film 5 of Cr or the like is formed into a lattice shape (as shown in FIG. 3(e)).

Since the recesses of the gaps of the colored layer can be filled with the organic film to have a flattened surface in accordance with the present example, the multi-color pattern was more effective for the display device than those of the foregoing examples.

EMBODIMENT 4

In a fourth example, a $SiO_2$ film was formed before formation of the ITO film of the foregoing examples by the sputtering method. As a result, the contacting property of the ITO film 4 was improved. Similar results were obtained by an inorganic film other than the $SiO_2$ film.

As has been described hereinbefore, according to the present invention, after the ITO film has been formed over the colored layer, the metal film is formed as the shielding film. As a result, there can be attained, by a remarkably simple process, effects in the improvement in the shielding efficiency of the shielding film, which has been impossible in the prior art, and the capability of forming the shielding film having an arbitrary pattern. Since, moreover, the ITO film and the metal film are laminated, another effect is that the ITO film can have its resistance resultantly reduced by the metal film even if it has a high resistance. Since the ITO film can be thinned, furthermore, it is possible to improve the transparency of the ITO film and to shorten the time period for forming the ITO film. The former can lead to an improvement in the quality of the multi-color pattern itself, and the latter can contribute to a reduction of the cost.

What is claimed is:
1. A method of manufacturing a color filter, comprising the steps of:
   forming a conductive film having stripe patterns on an insulative surface of a substrate such that gaps exist between the stripe patterns;
   forming a colored layer on the stripe patterns of the conductive film by electrodeposition such that gaps exist between the stripe patterns of the colored layer;
   forming a transparent conductive film over the stripe patterns of the colored layer and in the gaps; and
   forming a metal film having a lattice pattern directly on the transparent conductive film so as to shield light transmittance passing through the gaps between the stripe patterns of the colored layer on the conductive film.

2. A method of manufacturing a color filter according to claim 1, including a step of forming an inorganic film on the colored layer before the step of forming the transparent conductive film.

3. A method of manufacturing a color filter according to claim 1; wherein the step of forming the metal film comprises forming the metal film in the form of the lattice pattern to completely cover the gaps between the stripe patterns of the colored layer.

4. A method of manufacturing a color filter according to claim 3; wherein metal film is not disposed in the gaps.

5. A method of manufacturing a color filter according to claim 1; wherein metal film is not disposed in the gaps.

6. A method of manufacturing a color filter, comprising the steps of:
   forming a conductive film in the form of stripe patterns on an insulative surface of a substrate such that gaps exist between the stripe patterns;
   forming by electrodeposition colored layers on the respective stripe patterns of the conductive film such that gaps exist between the colored layers;
   forming a transparent conductive film over the colored layers and in the gaps between the colored layers; and
   forming a metal shield film directly on the transparent conductive film, the metal shield film being in the form of a lattice pattern which covers the gaps between the colored layers to shield against light leakage through the gaps.

7. A method according to claim 6; including the step of forming an organic film over the colored layers and in the gaps between the colored layers before forming the metal shield film.

8. A method according to claim 6; wherein the step of forming by electrodeposition colored layers comprises forming colored layers of different colors to form a multi-color filter.

9. A method of manufacturing a color filter according to claim 6; wherein the step of forming the metal shield film comprises forming the metal shield film in the form of the pattern to completely cover the gaps between the colored layers.

10. A method of manufacturing a color filter according to claim 9; wherein the metal shield film is not disposed in the gaps.

11. A method of manufacturing a color filter according to claim 6; wherein the metal shield film is not disposed in the gaps.

* * * * *